United States Patent
Pendse

(10) Patent No.: US 11,550,158 B2
(45) Date of Patent: Jan. 10, 2023

(54) ARTIFICIAL REALITY SYSTEM HAVING SYSTEM-ON-A-CHIP (SOC) INTEGRATED CIRCUIT COMPONENTS INCLUDING STACKED SRAM

(71) Applicant: Meta Platforms Technologies, LLC, Menlo Park, CA (US)

(72) Inventor: Rajendra D. Pendse, Fremont, CA (US)

(73) Assignee: META PLATFORMS TECHNOLOGIES, LLC, Menlo Park, CA (US)

(*) Notice: Subject to any disclaimer, the term of this patent is extended or adjusted under 35 U.S.C. 154(b) by 257 days.

(21) Appl. No.: 16/910,792

(22) Filed: Jun. 24, 2020

(65) Prior Publication Data
US 2021/0405382 A1    Dec. 30, 2021

(51) Int. Cl.
*G02B 27/01* (2006.01)
*G06T 19/00* (2011.01)
*H01L 27/11* (2006.01)

(52) U.S. Cl.
CPC ........ *G02B 27/0176* (2013.01); *G06T 19/006* (2013.01); *H01L 27/11* (2013.01)

(58) Field of Classification Search
CPC ........... G06T 19/006; G02B 27/017; G02B 27/0176; H01L 2224/0401; H01L 2224/05548; H01L 2224/0557; H01L 2224/131; H01L 2224/14181; H01L 2224/16145; H01L 2225/06513; H01L 2225/06517; H01L 2225/06544; H01L 24/13; H01L 24/14; H01L 24/16; H01L 25/0657; H01L 25/18; H01L 25/50; H01L 27/11; H01L 2924/00014; H01L 2924/014; H01L 2924/1437
See application file for complete search history.

(56) References Cited

U.S. PATENT DOCUMENTS

| | | | |
|---|---|---|---|
| 10,937,754 B1* | 3/2021 | Yang | H01L 24/85 |
| 2012/0212400 A1* | 8/2012 | Border | G02B 27/0172 345/8 |
| 2015/0303174 A1 | 10/2015 | Yu et al. | |
| 2017/0062357 A1* | 3/2017 | Kamgaing | H01L 24/19 |
| 2017/0170109 A1* | 6/2017 | Lee | H01L 23/13 |
| 2018/0356156 A1* | 12/2018 | Hurbi | F28D 15/0266 |
| 2020/0328186 A1 | 10/2020 | Liu | |
| 2022/0059455 A1* | 2/2022 | Chen | G11C 11/409 |
| 2022/0084922 A1* | 3/2022 | Lan | H01L 25/50 |

FOREIGN PATENT DOCUMENTS

CN    110192269 A    8/2019

OTHER PUBLICATIONS

International Search Report and Written Opinion for International Application No. PCT/US2021/035053, dated Sep. 7, 2021, 11 pages.

\* cited by examiner

*Primary Examiner* — Kenneth Bukowski
(74) *Attorney, Agent, or Firm* — Shumaker & Sieffert, P.A.

(57) ABSTRACT

Three-dimensional integrated circuit component(s) are described including a System-on-a-Chip (SoC) die and a separate static random-access memory (SRAM) subcomponent in a vertically stacked arrangement. Such stacked SoC/SRAM integrated circuit components may form part of a system to render artificial reality images.

32 Claims, 10 Drawing Sheets

ARTIFICIAL REALITY SYSTEM HAVING SYSTEM-ON-A-CHIP (SOC) INTEGRATED CIRCUIT COMPONENTS INCLUDING STACKED SRAM

TECHNICAL FIELD

This disclosure generally relates to artificial reality systems, such as augmented reality, mixed reality, and/or virtual reality systems, and semiconductor devices and semiconductor processing for these and other electronic systems.

BACKGROUND

Artificial reality systems are becoming increasingly ubiquitous with applications in many fields such as computer gaming, health and safety, industrial, and education. As a few examples, artificial reality systems are being incorporated into mobile devices, gaming consoles, personal computers, movie theaters, and theme parks. In general, artificial reality is a form of reality that has been adjusted in some manner before presentation to a user, which may include, e.g., a virtual reality, an augmented reality, a mixed reality, a hybrid reality, or some combination and/or derivatives thereof.

Typical artificial reality systems include one or more devices for rendering and displaying content to users. As one example, an artificial reality system may incorporate a head-mounted display (HMD) worn by a user and configured to output artificial reality content to the user. The artificial reality content may entirely comprise content that is generated by the system or may include generated content combined with captured content (e.g., real-world video and/or images). During operation, the user typically interacts with the artificial reality system to select content, launch applications, configure the system and, in general, experience artificial reality environments. Some artificial reality systems utilize specialized integrated circuits, often referred to as a System on a Chip (SoC), having complex functionality for aggregating and processing sensor data.

SUMMARY

In general, the present disclosure describes three-dimensional integrated circuit component(s) including a System-on-a-Chip (SoC) die and a separate static random-access memory (SRAM) subcomponent in a vertically stacked arrangement. The disclosure also describes semiconductor manufacturing methods for fabricating such stacked SoC/SRAM integrated circuit components. The disclosure also describes devices and systems, for example artificial reality devices and systems (including virtual reality, augmented reality, and mixed reality), in which such stacked SoC/SRAM integrated circuit components may form part of a system to render artificial reality images.

In some examples, the SoC die and SRAM subcomponent are face-to-face bonded in a vertically stacked arrangement. Further, as described, through-silicon vias (TSVs) formed in non-functional areas around the periphery of the SoC's active circuitry are used to bring Input/Output (I/O) from the active side of the SoC to the opposing side. The TSVs may be formed from the backside of the SoC to bonding pads on the frontside of the SoC.

By stacking the SRAM with the SoC die, the physical dimensions (e.g., length and width) of the stacked SoC/SRAM integrated circuit component may be significantly reduced as compared to traditional SoCs with on-die SRAM. In addition, the physical dimensions of the stacked SRAM subcomponent may be increased as compared to traditional on-die SRAM. The stacked SRAM subcomponent may thus provide sufficient memory capacity to perform the functions of both on-die SRAM and high-speed local memory required with traditional SoC components, thus eliminating the need for a separate high-speed local memory subcomponent. The stacked SoC/SRAM integrated circuit component described herein, and the described methods for manufacturing the stacked SoC/SRAM integrated circuit component, may provide technical solutions to the miniaturization problem of the on-die SRAM and may also result in a reduction in parasitic effects and reduced power consumption due to a decrease in the length of the signal paths provided by the perimeter TSV's. Use of TSVs in non-functional areas, as described herein, may also increase design flexibility in that the TSVs are not located within the active circuitry of the SoC die. In addition, the techniques described herein enable fabrication of the SoC/SRAM stack and formation of the TSVs to be carried out at separate facilities, if desired, thus increasing manufacturing flexibility and reducing cost.

In one example, the disclosure is directed to an artificial reality system comprising a head mounted display (HMD) configured to output artificial reality content, the HMD including at least one stacked integrated circuit component, wherein the at least one stacked integrated circuit component comprises: an SoC die having a frontside and a backside, wherein the frontside of the SoC die includes an active area including one or more active elements, and wherein the frontside of the SoC die further includes at least one non-active area outside of the active area; a static random-access memory (SRAM) subcomponent bonded to the SoC die in a face-to-face, vertically stacked arrangement; and a plurality of through-silicon vias (TSVs) formed from the backside of the SoC die to the frontside of the SoC die, the plurality of TSVs formed in the at least one non-active area. The at least one non-active area may be located around the periphery of the active area. The plurality of TSVs may be formed in the at least one non-active area around the periphery of the active area. The plurality of TSVs may be formed from the backside of the SoC die to bonding pads patterned on or near the frontside of the SoC die in the at least one non-active area.

The system may further include a plurality of sensors configured to output motion data representative of motion of a user, wherein the SoC processes the motion data representative of motion of a user received from one or more of the plurality of sensors. The plurality of sensors may include at least one inertial measurement unit. The system may further include one or more image capture devices configured to output image data representative of a physical environment corresponding to a viewing perspective of the HMD, wherein the SoC processes the image data representative of the physical environment received from one or more of the image capture devices. The SRAM subcomponent may include a single SRAM die or may include a stack of multiple SRAM die.

In another example, the disclosure is directed to an integrated circuit component comprising an SoC die having a frontside and a backside, wherein the frontside of the SoC die includes an active area including one or more active elements, and wherein the frontside of the SoC die further includes at least one non-active area outside of the active area; a static random-access memory (SRAM) subcomponent bonded to the SoC die in a face-to-face, vertically stacked arrangement; and a plurality of through-silicon vias (TSVs) formed from the backside of the SoC die to the frontside of the SoC die, the plurality of TSVs formed in the at least one non-active area.

The at least one non-active area may be located around the periphery of the active area. The plurality of TSVs may be formed in the at least one non-active area around the periphery of the active area. The plurality of TSVs may be formed from the backside of the SoC die to bonding pads patterned on or near the frontside of the SoC die in the at least one non-active area. The SRAM subcomponent may include a single SRAM die or may include a stack of multiple SRAM die.

In another example, the disclosure is directed to a method comprising providing a system-on-a-chip (SoC) die having a frontside and an oppositely facing backside; bonding the frontside of the SoC die to a frontside of a static random-access memory (SRAM) subcomponent in a face-to-face, vertically stacked arrangement, wherein the frontside of the SoC die includes an active area including one or more active elements, and wherein the frontside of the SoC die further includes at least one non-active area outside of the active area; thinning the SoC die from a first thickness to a second thickness, wherein the first thickness is relatively greater than the second thickness, and wherein the thinning includes thinning the SoC die from the backside of the SoC die; forming a plurality of through-silicon vias (TSVs) from the backside of the SoC die to the frontside of the SoC die, the plurality of TSVs formed in the at least one non-active area; and metallizing the TSVs from the backside of the SoC die to the frontside of the SoC die.

Bonding the active side of the SoC die to the active side of the SRAM subcomponent in the face-to-face, vertically stacked arrangement may be performed at a first fabricating facility, and thinning the SoC die from the first thickness to the second thickness, forming the plurality of through-silicon vias from the backside of the SoC die to the front side of the SoC die, and metallizing the TSVs from the backside of the SoC die may be performed at a second, different fabricating facility.

Thinning the SoC die may include performing a mechanical grinding process on the backside of the SoC die. The TSVs may be formed by a via-last through-silicon via technology. Thinning the SoC die may include thinning the backside of the SoC die from a thickness of about 775 micrometers ($\mu m$) to a thickness in a range of about 25 to 200 $\mu m$. Thinning the SoC die may include thinning the backside of the SoC die to the second thickness such that TSVs may be formed from the backside of the SoC die to bonding pads on the frontside of the SoC die without requiring a TSV reveal process. Thinning the SoC die from a first thickness to a second thickness and forming the plurality of through-silicon vias (TSVs) from the backside of the SoC die to the frontside of the SoC die may occur before bonding the frontside of the SoC die to a frontside of the static random-access memory (SRAM) subcomponent in a face-to-face, vertically stacked arrangement.

The at least one non-active area may be located around the periphery of the active area. Metallizing the TSVs may further comprise metallizing the TSVs from the backside of the SoC die to bonding pads patterned on the frontside of the SoC die in the at least one non-active area. The SRAM subcomponent may include a single SRAM die or may include a stack of multiple SRAM die.

DETAILED DESCRIPTION

Figure 1:
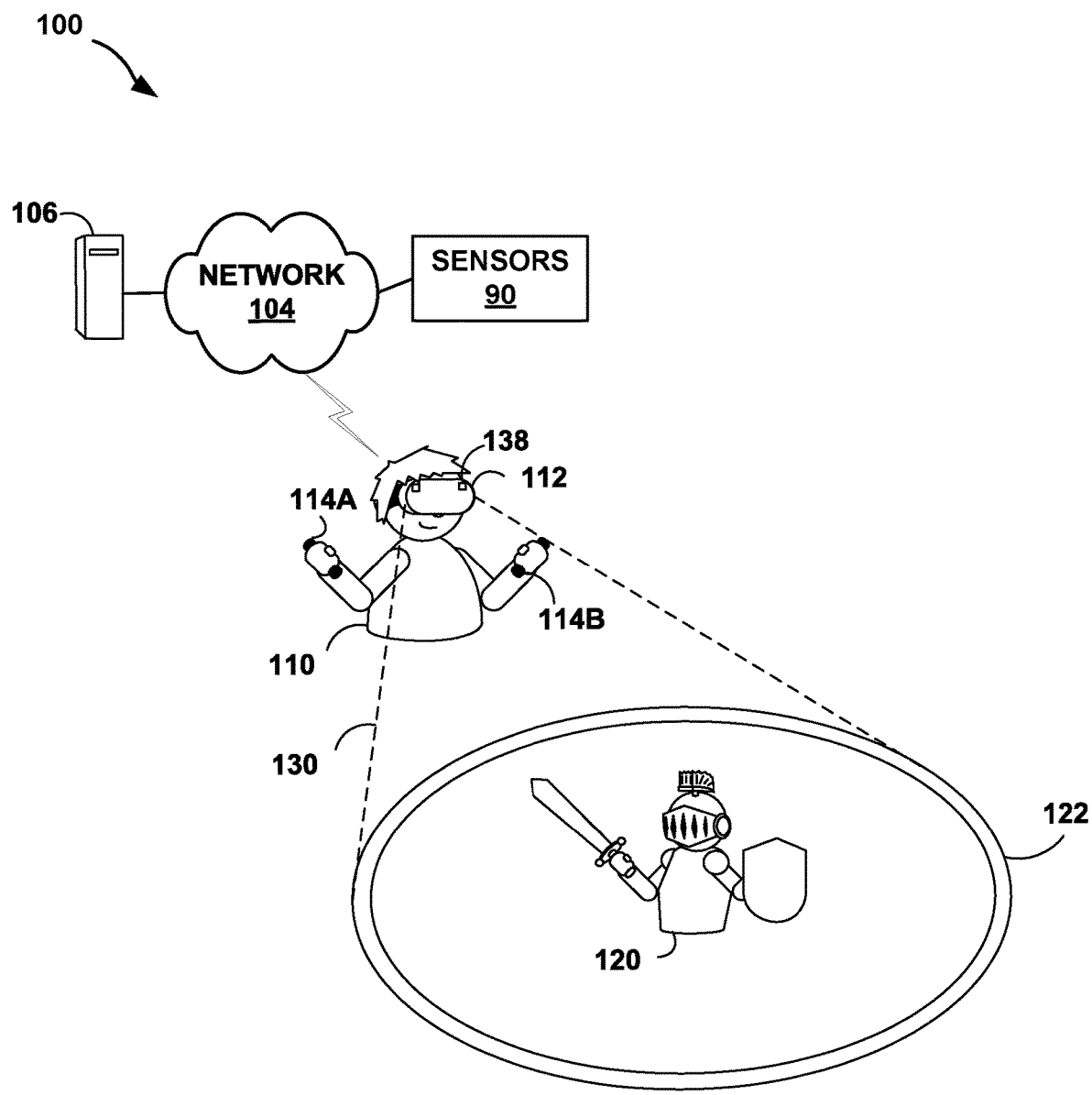
FIG. 1 is an illustration depicting an example artificial reality system that includes an IC component including a SoC die and a SRAM subcomponent in a stacked configuration, in accordance with the techniques described in this disclosure.

In general, the present disclosure describes three-dimensional integrated circuit (IC) component(s) including a System-on-a-Chip (SoC) die and a static random-access memory (SRAM) subcomponent in a vertically stacked arrangement. The disclosure also describes semiconductor manufacturing methods for fabricating such stacked SoC/SRAM integrated circuit components. The disclosure also describes devices, for example artificial reality devices (including virtual reality, augmented reality, and mixed reality), in which such stacked SoC/SRAM integrated circuit components may form part of a system to render artificial reality images. The stacked SoC die/SRAM component may be integrated with other digital and analog circuitry, such as a main processor, one or more sensors, a display, etc., to form a miniaturized display package.

In systems ranging from AR/VR to autonomous driving and AI-at-the-edge, an IC component, often referred to as a System on a Chip (SoC), is often used to aggregate and process sensor data. In many example implementations, the SoC typically communicates with a main processor and a physical actuating system. The internal structure of such an IC component usually comprises a SoC die, a high-speed local memory and an optional non-volatile memory to store calibration data. Furthermore, the SoC die itself has an on-die SRAM to serve as a cache memory or otherwise enable high-speed computing operations performed by the SoC. A traditional SoC integrated circuit component includes a die having an on-die SRAM that typically occupies 30-40% of the physical area of the die, along with a high-speed local memory subcomponent (such as dynamic random-access memory (DRAM)) separate or external from the SoC and its on-die SRAM. However, as advances in semiconductor processing continue to achieve smaller and smaller minimum feature sizes, the physical size of the SRAM does not scale commensurately. The on-die SRAM can therefore limit miniaturization of such traditional SoC components.

The present disclosure describes three-dimensional integrated circuit component(s) including a SoC die and a SRAM subcomponent in a vertically stacked arrangement. In some examples, the SoC die and SRAM subcomponent are face-to-face bonded. Through-silicon vias (TSVs) formed around the periphery of the SoC's active circuitry are used to bring Input/Output (I/O) from the active side of the SoC to the opposing side. The TSVs may be formed from the backside of the SoC to bonding pads on the frontside of the SoC.

The SRAM subcomponent could be a single SRAM die or a mini-stack of multiple SRAM die referred to herein as a "SRAM cube." The "SRAM cube" version may help to expand the memory capacity of the SRAM thereby making it easier to eliminate the need for a local memory (DRAM).

As described herein, the techniques enable a fabrication process for manufacturing the stacked SoC/SRAM component according to a multi-stage process having a first stage and a second stage. The first stage of the fabrication process includes face-to-face bonding an SoC die and a SRAM subcomponent. The first stage may be performed at a first location, such as a first semiconductor fabrication plant or foundry. During face-to-face bonding, the SoC I/O pads are connected to the SRAM I/O pads directly with no intermediate redistribution layer (RDL) routing, which enables higher bandwidth and performance with lower power dissipation. A second stage of the fabrication process includes formation of TSVs around the periphery of the SoC active circuitry. The TSVs may be formed from the backside of the SoC die to bonding pads on the frontside of the SoC die. The second stage of the fabrication process also includes metallization of the TSVs and patterning of redistribution layers (RDLs) on the backside of the SoC wafer.

In some examples, the second stage of the fabrication process may be performed at the first location. In other examples, the second stage of the fabrication process may be performed at a second, different location, such as a different semiconductor fabrication and/or packaging facility. In those examples where the second stage of the fabrication process is performed at a different location than the first stage, the second stage may also include thinning the SoC die to a desired thickness before forming the TSVs. In those examples, the thickness of the SoC die produced during the first stage of the fabrication process may be greater than the final thickness of the SoC die after completion of the second stage to aid in shipping and transport between the first location and the second location. The second stage may therefore include thinning the SoC die, for example by grinding down the backside of the SoC wafer from a first thickness to a second thickness that is relatively less than the first thickness. In this way, the thinned SoC die has a thickness dimension in which TSVs may be formed from the backside of the SoC die to bonding pads on the frontside of the SoC die without requiring a TSV reveal process.

By partitioning the SRAM from the SoC die and instead placed as a separate subcomponent in a stacked configuration with the SoC die, the physical dimensions (e.g., length and/or width) of the stacked SoC/SRAM component may be significantly reduced as compared to traditional SoCs in which the SRAM is formed on-die with the SoC circuitry. In addition, the physical dimensions of the stacked SRAM subcomponent may be increased as compared to traditional on-die SRAM. The stacked SRAM subcomponent may thus provide sufficient memory capacity to perform the functions of both the on-die SRAM and high-speed local memory required with traditional SoC components, thus eliminating the need for a separate high-speed local memory subcomponent. The stacked SoC/SRAM component may help solve the miniaturization problem of the on-die SRAM and may also result in a reduction in parasitic effects and reduced power consumption due to a decrease in the length of the signal paths provided by virtue of the very short face to face interconnections between the SRAM with the SoC and the short length of the TSV's. Use of TSVs in non-functional areas may also increase design flexibility in that the TSVs are not located within the active circuitry of the SoC die. In addition, fabrication of the SoC/SRAM stack and formation of the TSVs may be carried out at separate facilities, thus increasing manufacturing flexibility and reducing cost.

FIG. 1 is an illustration depicting an example artificial reality (AR) system in which stacked SoC/SRAM integrated circuit component(s) may form part of a system to render artificial reality images, in accordance with the techniques described in this disclosure. The artificial reality system may be a virtual reality system, an augmented reality system, or a mixed reality system. In the example of FIG. 1, artificial reality system 100 includes a head mounted display (HMD) 112, one or more controllers 114A and 114B (collectively, "controller(s) 114"), and may in some examples include one or more external sensors 90 and/or a console 106.

HMD 112 is typically worn by user 110 and includes an electronic display and optical assembly for presenting artificial reality content 122 to user 110. In addition, HMD 112 includes one or more sensors (e.g., accelerometers) for tracking motion of the HMD 112 and may include one or more image capture devices 138 (e.g., cameras, line scanners) for capturing image data of the surrounding physical environment. Although illustrated as a head-mounted display, AR system 100 may alternatively, or additionally, include glasses or other display devices for presenting artificial reality content 122 to user 110.

Each of controller(s) 114 is an input device that user 110 may use to provide input to console 106, HMD 112, or another component of AR system 100. Controller 114 may include one or more presence-sensitive surfaces for detecting user inputs by detecting a presence of one or more objects (e.g., fingers, stylus) touching or hovering over locations of the presence-sensitive surface. In some examples, controller(s) 114 may include an output display, which may be a presence-sensitive display. In some examples, controller(s) 114 may be a smartphone, tablet computer, personal data assistant (PDA), or other hand-held device. In some examples, controller(s) 114 may be a smartwatch, smartring, or other wearable device. Controller(s) 114 may also be part of a kiosk or other stationary or mobile system. Alternatively, or additionally, controller(s) 114 may include other user input mechanisms, such as one or more buttons, triggers, joysticks, D-pads, or the like, to enable a user to interact with and/or control aspects of the artificial reality content 122 presented to user 110 by AR system 100.

In this example, console 106 is shown as a single computing device, such as a gaming console, workstation, a desktop computer, or a laptop. In other examples, console 106 may be distributed across a plurality of computing devices, such as a distributed computing network, a data center, or a cloud computing system. Console 106, HMD 112, and sensors 90 may, as shown in this example, be communicatively coupled via network 104, which may be a wired or wireless network, such as Wi-Fi, a mesh network or a short-range wireless communication medium, or combination thereof. Although HMD 112 is shown in this example as being in communication with, e.g., tethered to or in wireless communication with, console 106, in some implementations HMD 112 operates as a stand-alone, mobile AR system, and AR system 100 may omit console 106.

In general, AR system 100 renders artificial reality content 122 for display to user 110 at HMD 112. In the example of FIG. 1, a user 110 views the artificial reality content 122 constructed and rendered by an artificial reality application executing on HMD 112 and/or console 106. In some examples, the artificial reality content 122 may be fully artificial, i.e., images not related to the environment in which user 110 is located. In some examples, artificial reality content 122 may comprise a mixture of real-world imagery (e.g., a hand of user 110, controller(s) 114, other environmental objects near user 110) and virtual objects 120 to produce mixed reality and/or augmented reality. In some examples, virtual content items may be mapped (e.g., pinned, locked, placed) to a particular position within artificial reality content 122, e.g., relative to real-world imagery. A position for a virtual content item may be fixed, as relative to one of a wall or the earth, for instance. A position for a virtual content item may be variable, as relative to controller(s) 114 or a user, for instance. In some examples, the particular position of a virtual content item within artificial reality content 122 is associated with a position within the real-world, physical environment (e.g., on a surface of a physical object).

During operation, the artificial reality application constructs artificial reality content 122 for display to user 110 by tracking and computing pose information for a frame of reference, typically a viewing perspective of HMD 112. Using HMD 112 as a frame of reference, and based on a current field of view as determined by a current estimated pose of HMD 112, the artificial reality application renders 3D artificial reality content which, in some examples, may be overlaid, at least in part, upon the real-world, 3D physical environment of user 110. During this process, the artificial reality application uses sensed data received from HMD 112 and/or controllers 114, such as movement information and user commands, and, in some examples, data from any external sensors 90, such as external cameras, to capture 3D information within the real world, physical environment, such as motion by user 110 and/or feature tracking information with respect to user 110. Based on the sensed data, the artificial reality application determines a current pose for the frame of reference of HMD 112 and, in accordance with the current pose, renders the artificial reality content 122.

AR system 100 may trigger generation and rendering of virtual content items based on a current field of view 130 of user 110, as may be determined by real-time gaze tracking of the user, or other conditions. More specifically, image capture devices 138 of HMD 112 capture image data representative of objects in the real-world, physical environment that are within a field of view 130 of image capture devices 138. Field of view 130 typically corresponds with the viewing perspective of HMD 112. In some examples, the artificial reality application presents artificial reality content 122 comprising mixed reality and/or augmented reality. The artificial reality application may render images of real-world objects, such as the portions of a peripheral device, the hand, and/or the arm of the user 110, that are within field of view 130 along with virtual objects 120, such as within artificial reality content 122. In other examples, the artificial reality application may render virtual representations of the portions of a peripheral device, the hand, and/or the arm of the user 110 that are within field of view 130 (e.g., render real-world objects as virtual objects 120) within artificial reality content 122. In either example, user 110 is able to view the portions of their hand, arm, a peripheral device and/or any other real-world objects that are within field of view 130 within artificial reality content 122. In other examples, the artificial reality application may not render representations of the hand or arm of user 110.

To provide virtual content alone, or overlaid with real-world objects in a scene, HMD 112 may include a display system. For example, the display may include a projector and waveguide configured to translate the image output by the projector to a location viewable by a user's eye or eyes. The projector may include a display and a projector lens. The waveguide may include an input grating coupler to redirect light from the projector into the waveguide, and the waveguide may "trap" the light via total internal reflection (TIR). For example, the display may include arrays of red, green, and blue LEDs. In some examples, a color image may be formed by combination of the red, green, and blue light from each of the red, green, and blue LED arrays via a combiner. The waveguide may include an output grating to redirect light out of the waveguide, for example, towards an eyebox. In some examples, the projector lens may collimate light from the display, e.g., the display may be located substantially at a focal point of the projector lens. The grating coupler may redirect the collimated light from the display into the waveguide, and the light may propagate within the waveguide via TIR at the surfaces of the waveguide. The waveguide may include an output structure, e.g. holes, bumps, dots, a holographic optical element (HOE), a diffractive optical element (DOE), etc., to redirect light from the waveguide to a user's eye, which focuses the collimated light from the display of the projector on the user's retina, thereby reconstructing the display image on the user's retina. In some examples, the TIR of the waveguide functions as a mirror and does not significantly affect the image quality of the display, e.g., the user's view of the display is equivalent to viewing the display in a mirror.

As further described herein, one or more devices of artificial reality system 100, such as HMD 112, controllers 114 and/or a console 106, may include one or more SoC integrated circuits. Further, one of more of the SoC may comprise an SoC die and a SRAM subcomponent arranged and interconnected in a vertically stacked arrangement in accordance with the techniques described herein.

Figure 2A:
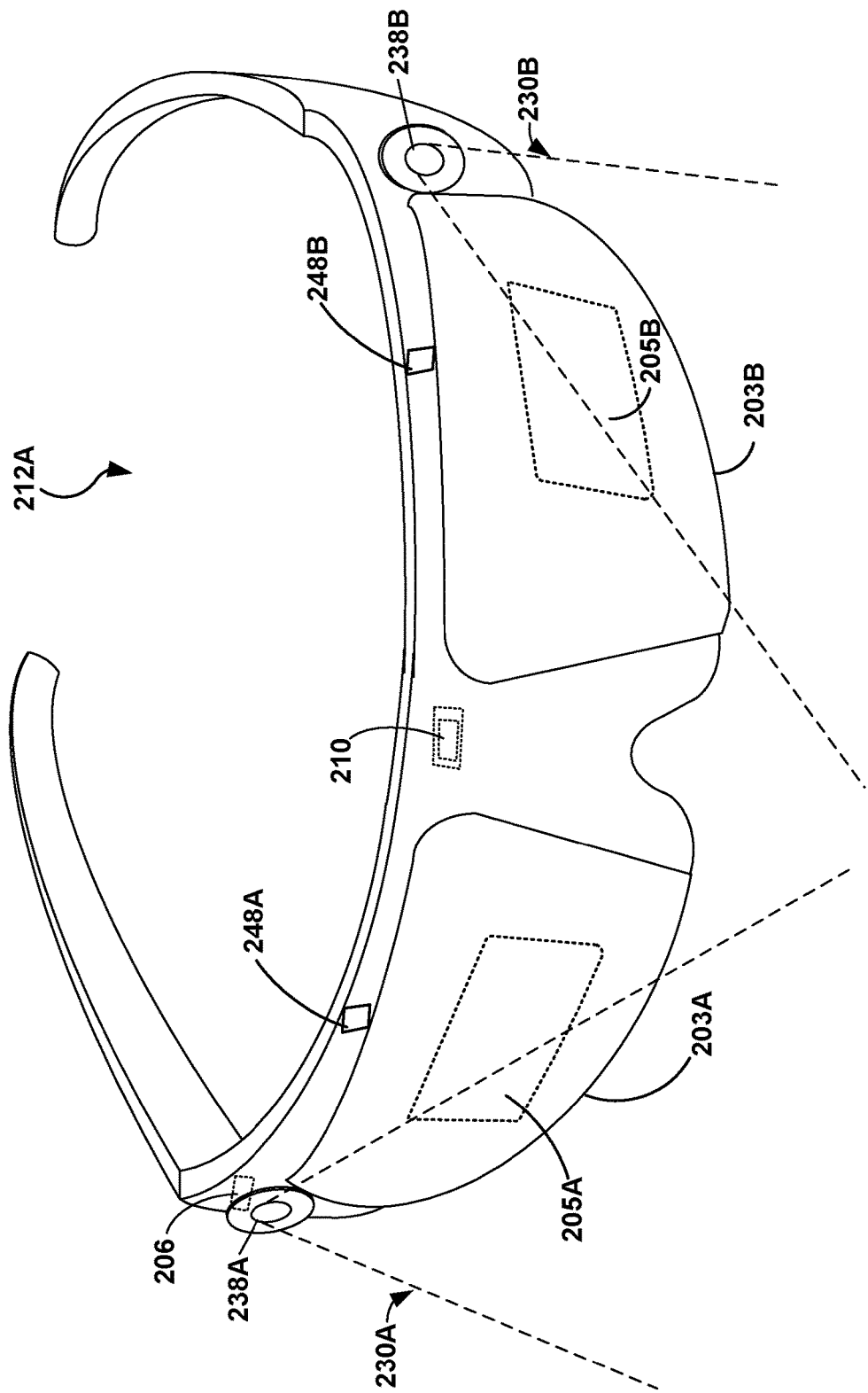
FIG. 2A is an illustration depicting an example HMD that includes an IC component including a SoC die and a SRAM subcomponent in a stacked configuration, in accordance with techniques described in this disclosure.

FIG. 2A is an illustration depicting an example HMD 212A that includes a stacked SoC/SRAM integrated circuit component, in accordance with techniques described in this disclosure. HMD 212A of FIG. 2A may be an example of HMD 112 of FIG. 1. As shown in FIG. 2A, HMD 212A may take the form of glasses. HMD 212A may be part of an artificial reality system, such as AR system 100 of FIG. 1, or may operate as a stand-alone, mobile artificial realty system configured to implement the techniques described herein.

In this example, HMD 212A are glasses comprising a front frame including a bridge to allow the HMD 212A to rest on a user's nose and temples (or "arms") that extend over the user's ears to secure HMD 212A to the user. In addition, HMD 212A of FIG. 2A includes one or more waveguides 203A and 203B (collectively, "waveguides 203") and one or more waveguide output structures 205A and 205B (collectively, "waveguide output structures 205") configured to redirect light out of the waveguides 205A and 205B. In the example shown, projectors 148A and 148B (collectively, "projectors 248") may input light, e.g., collimated light, into waveguides 203A and 203B via a grating coupler (not shown) that redirects light from the projectors 248 into waveguides 203 such that the light is "trapped" via total internal reflection (TIR) within the waveguide. For example, projectors 248A and 248B may include a display and a projector lens. In some examples, waveguides 203 may be transparent and alternatively may be referred to as "windows 203" hereinafter. In some examples, the known orientation and position of windows 203 relative to the front frame of HMD 212A is used as a frame of reference, also referred to as a local origin, when tracking the position and orientation of HMD 212A for rendering artificial reality content according to a current viewing perspective of HMD 212A and the user. In some examples, projectors 248 can provide a stereoscopic display for providing separate images to each eye of the user.

In the example shown, waveguide output structures 205 cover a portion of the windows 203, subtending a portion of the field of view 230 viewable by a user 110 through the windows 203. In other examples, the waveguide output structures 205 can cover other portions of the windows 203, or the entire area of the windows 205.

As further shown in FIG. 2A, in this example, HMD 212 further includes one or more motion sensors 206, one or more integrated image capture devices 238A and 238B (collectively, "image capture devices 238"), an internal control unit 210, which may include an internal power source and one or more printed-circuit boards having one or more processors, memory, and hardware to provide an operating environment for executing programmable operations to process sensed data and present artificial reality content on waveguide output structures 205. Internal control unit 210 may include a stacked SoC/SRAM integrated circuit component in accordance with the present disclosure that receives information from one or more of sensor(s) 206, image capture devices 238, controller(s) such as controller(s) 114 as shown in FIG. 1, and/or other sensors, and that forms part of a computing system to process the sensed data and present artificial reality content on waveguide output structures 205 in accordance with the present disclosure.

Figure 2B:
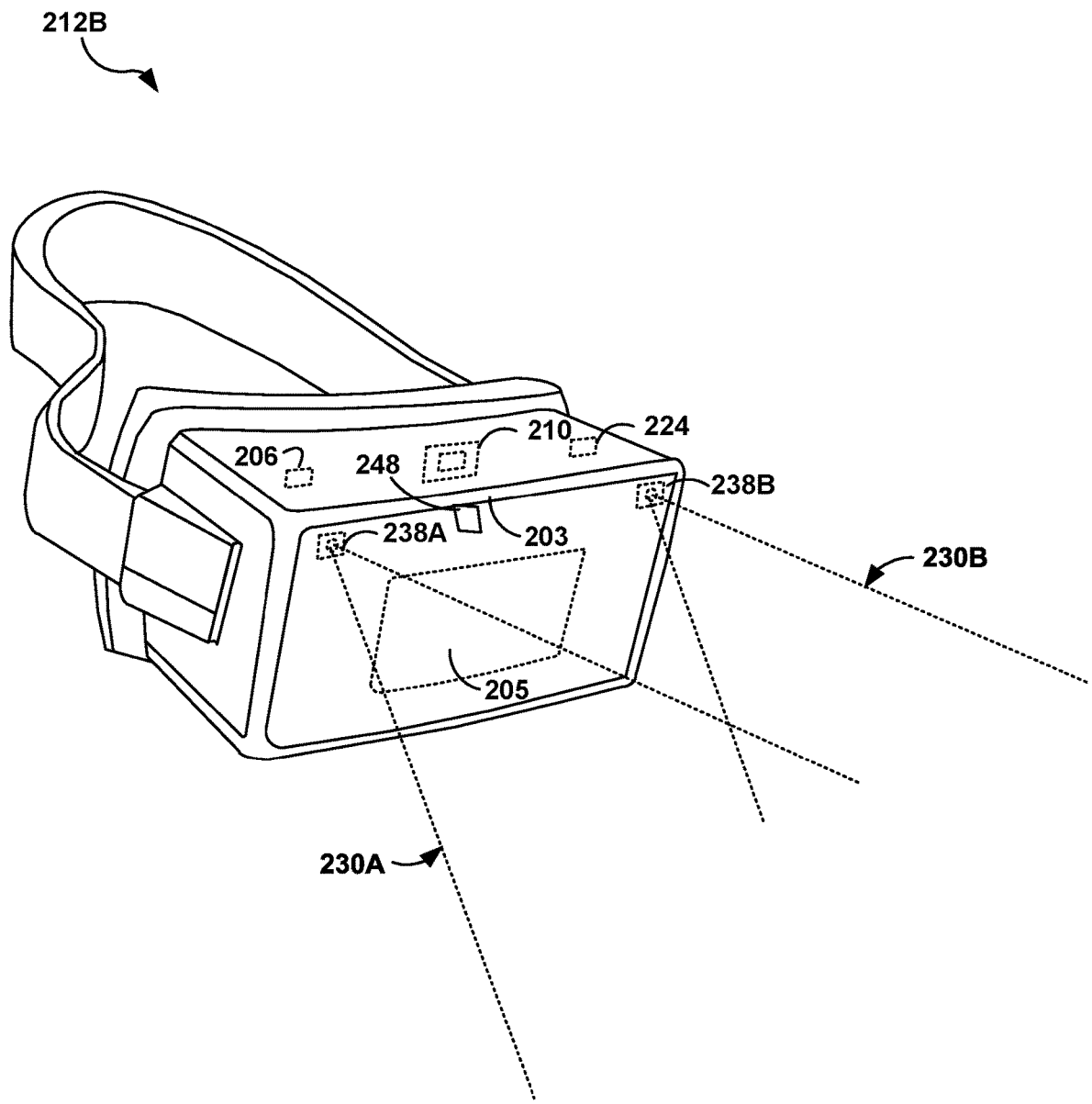
FIG. 2B is an illustration depicting another example HMD that includes an IC component including a SoC die and a SRAM subcomponent in a stacked configuration, in accordance with techniques described in this disclosure.

FIG. 2B is an illustration depicting another example HMD that includes a multi-functional DOE. HMD 212B may be part of an artificial reality system, such as artificial reality system 100 of FIG. 1, or may operate as a stand-alone, mobile artificial realty system configured to implement the techniques described herein.

In this example, HMD 212B includes a front rigid body and a band to secure HMD 212B to a user. In addition, HMD 212B includes a waveguide 203 (or, alternatively, a window 203) configured to present artificial reality content to the user via a waveguide output structure 205. In the example shown, projector 248 may input light, e.g. collimated light, into waveguide 203 via an input grating coupler (not shown) that redirects light from projector(s) 248 into waveguide 203 such that the light is "trapped" via total internal reflection (TIR) within waveguide 203. For example, projectors 248 may include a display and a projector lens. In some examples, the known orientation and position of waveguide 203 relative to the front rigid body of HMD 212B is used as a frame of reference, also referred to as a local origin, when tracking the position and orientation of HMD 212B for rendering artificial reality content according to a current viewing perspective of HMD 212B and the user. In other examples, HMD 212B may take the form of other wearable head mounted displays, such as glasses or goggles.

Figure 3:
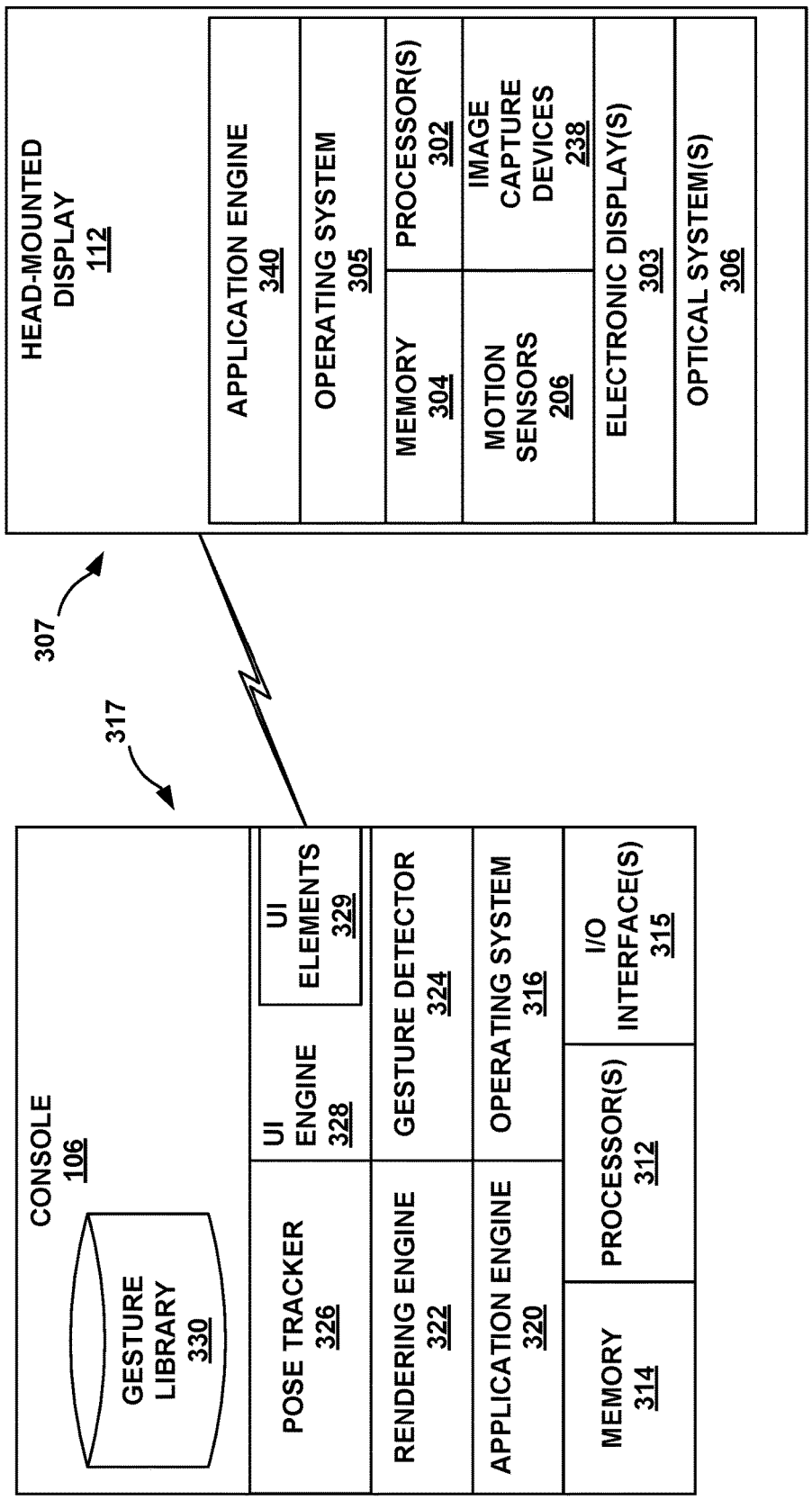
FIG. 3 is a block diagram showing example implementations of a console and an HMD of the artificial reality system of FIG. 1, in accordance with techniques described in this disclosure.

FIG. 3 is a block diagram showing example implementations of an artificial reality system that includes console 106 and HMD 112, in accordance with techniques described in this disclosure. In the example of FIG. 3, console 106 performs pose tracking, gesture detection, and user interface generation and rendering for HMD 112 based on sensed data, such as motion data and image data received from HMD 112 and/or external sensors.

In this example, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment for executing one or more software components 307, including application engine 340. As discussed with respect to the examples of FIGS. 2A and 2B, processors 302 are coupled to electronic display 303, motion sensors 206, image capture devices 138, and, in some examples, optical system 306. In some examples, processors 302 and memory 304 may be separate, discrete components. In other examples, memory 304 may be on-chip memory collocated with processors 302 within a single integrated circuit. In some examples, functionality of processors 302 and/or memory 304 for aggregating and processing sensed data may be implemented as a stacked SoC/SRAM integrated circuit component manufactured and arranged in accordance with the present disclosure.

In some examples, optical system 306 may include projectors and waveguides for presenting virtual content to a user, as described above with respect to FIGS. 2A and 2B. For example, optical system 306 may include a projector including electronic display 303 and a projection lens.

In general, console 106 is a computing device that processes image and tracking information received from image capture devices 138 to perform gesture detection and user interface and/or virtual content generation for HMD 112. In some examples, console 106 is a single computing device, such as a workstation, a desktop computer, a laptop, or gaming system. In some examples, at least a portion of console 106, such as processors 312 and/or memory 314, may be distributed across a cloud computing system, a data center, or across a network, such as the Internet, another public or private communications network, for instance, broadband, cellular, Wi-Fi, and/or other types of communication networks for transmitting data between computing systems, servers, and computing devices.

In the example of FIG. 3, console 106 includes one or more processors 312 and memory 314 that, in some examples, provide a computer platform for executing an operating system 316, which may be an embedded, real-time multitasking operating system, for instance, or other type of operating system. In turn, operating system 316 provides a multitasking operating environment for executing one or more software components 317. Processors 312 are coupled to one or more I/O interfaces 315, which provides one or more I/O interfaces for communicating with external devices, such as a keyboard, game controller(s), display device(s), image capture device(s), HMD(s), peripheral device(s), and the like. Moreover, the one or more I/O interfaces 315 may include one or more wired or wireless network interface controllers (NICs) for communicating with a network, such as network 104.

Software applications 317 of console 106 operate to provide an overall artificial reality application. In this example, software applications 317 include application engine 320, rendering engine 322, gesture detector 324, pose tracker 326, and user interface engine 328.

In general, application engine 320 includes functionality to provide and present an artificial reality application, e.g., a teleconference application, a gaming application, a navigation application, an educational application, training or simulation applications, and the like. Application engine 320 may include, for example, one or more software packages, software libraries, hardware drivers, and/or Application Program Interfaces (APIs) for implementing an artificial reality application on console 106. Responsive to control by application engine 320, rendering engine 322 generates 3D artificial reality content for display to the user by application engine 340 of HMD 112.

Application engine 320 and rendering engine 322 construct the artificial content for display to user 110 in accordance with current pose information for a frame of reference, typically a viewing perspective of HMD 112, as determined by pose tracker 326. Based on the current viewing perspective, rendering engine 322 constructs the 3D, artificial reality content which may in some cases be overlaid, at least in part, upon the real-world 3D environment of user 110. During this process, pose tracker 326 operates on sensed data received from HMD 112, such as movement information and user commands, and, in some examples, data from any external sensors 90 (FIG. 1), such as external cameras, to capture 3D information within the real-world environment, such as motion by user 110 and/or feature tracking information with respect to user 110. Based on the sensed data, pose tracker 326 determines a current pose for the frame of reference of HMD 112 and, in accordance with the current pose, constructs the artificial reality content for communication, via the one or more I/O interfaces 315, to HMD 112 for display to user 110.

Pose tracker 326 may determine a current pose for HMD 112 and, in accordance with the current pose, triggers certain functionality associated with any rendered virtual content (e.g., places a virtual content item onto a virtual surface, manipulates a virtual content item, generates and renders one or more virtual markings, generates and renders a laser pointer). In some examples, pose tracker 326 detects whether the HMD 112 is proximate to a physical position corresponding to a virtual surface (e.g., a virtual pinboard), to trigger rendering of virtual content.

User interface engine 328 is configured to generate virtual user interfaces for rendering in an artificial reality environment. User interface engine 328 generates a virtual user interface to include one or more virtual user interface elements 329, such as a virtual drawing interface, a selectable menu (e.g., drop-down menu), virtual buttons, a directional pad, a keyboard, or other user-selectable user interface elements, glyphs, display elements, content, user interface controls, and so forth.

Console 106 may output this virtual user interface and other artificial reality content, via a communication channel, to HMD 112 for display at HMD 112.

Based on the sensed data from any of the image capture devices 138, or other sensor devices, gesture detector 324 analyzes the tracked motions, configurations, positions, and/or orientations of controllers 114 and/or objects (e.g., hands, arms, wrists, fingers, palms, thumbs) of the user 110 to identify one or more gestures performed by user 110. More specifically, gesture detector 324 analyzes objects recognized within image data captured by image capture devices 138 of HMD 112 and/or sensors 90 and external cameras 102 to identify controller(s) 114 and/or a hand and/or arm of user 110, and track movements of controller(s) 114, hand, and/or arm relative to HMD 112 to identify gestures performed by user 110. In some examples, gesture detector 324 may track movement, including changes to position and orientation, of controller(s) 114, hand, digits, and/or arm based on the captured image data, and compare motion vectors of the objects to one or more entries in gesture library 330 to detect a gesture or combination of gestures performed by user 110. In some examples, gesture detector 324 may receive user inputs detected by presence-sensitive surface(s) of controller(s) 114 and process the user inputs to detect one or more gestures performed by user 110 with respect to controller(s) 114.

Figure 4:
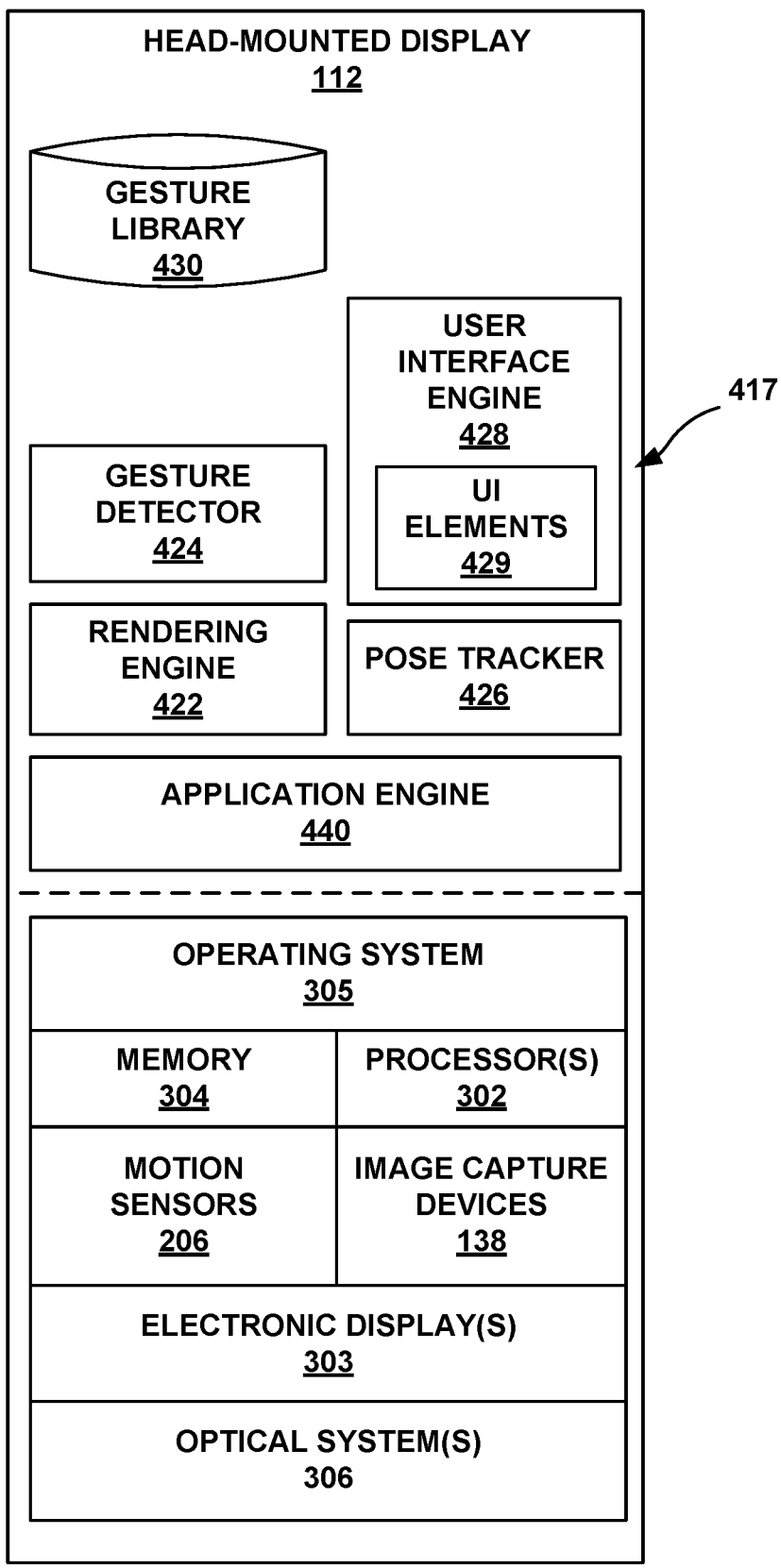
FIG. 4 is a block diagram depicting an example HMD of the artificial reality system of FIG. 1, in accordance with the techniques described in this disclosure.

FIG. 4 is a block diagram depicting an example in which HMD 112 is a standalone artificial reality system. In this example, like FIG. 3, HMD 112 includes one or more processors 302 and memory 304 that, in some examples, provide a computer platform for executing an operating system 305, which may be an embedded, real-time multi-tasking operating system, for instance, or other type of operating system. In turn, operating system 305 provides a multitasking operating environment for executing one or more software components 417. Moreover, processor(s) 302 are coupled to electronic display(s) 203, varifocal optical system(s) 205, motion sensors 206, and image capture devices 138. In some examples, functionality of processors 302 and/or memory 304 for aggregating and processing sensed data may be implemented as a stacked SoC/SRAM integrated circuit component manufactured and arranged in accordance with the present disclosure.

In some examples, optical system 306 may include projectors and waveguides for presenting virtual content to a user, as described above with respect to FIGS. 2A-2B. For example, optical system 306 may include a projector including electronic display 303 and a projection lens. The projection lens may further include a multi-functional DOE that functions as both a grating coupler to redirect light into a waveguide and as a lens element improving the imaging quality of the projector lens.

In the example of FIG. 4, software components 417 operate to provide an overall artificial reality application. In this example, software applications 417 include application engine 440, rendering engine 422, gesture detector 424, pose tracker 426, and user interface engine 428. In various examples, software components 417 operate similar to the counterpart components of console 106 of FIG. 3 (e.g., application engine 320, rendering engine 322, gesture detector 324, pose tracker 326, and user interface engine 328) to construct virtual user interfaces overlaid on, or as part of, the artificial content for display to user 110.

Similar to the examples described with respect to FIG. 3, based on the sensed data from any of the image capture devices such as image capture devices 138, 238 or 102, controller(s) 114, and/or other sensor devices, gesture detector 424 analyzes the tracked motions, configurations, positions, and/or orientations of controller(s) 114 and/or objects (e.g., hands, arms, wrists, fingers, palms, thumbs) of the user 110 to identify one or more gestures performed by user 110.

Figure 5:
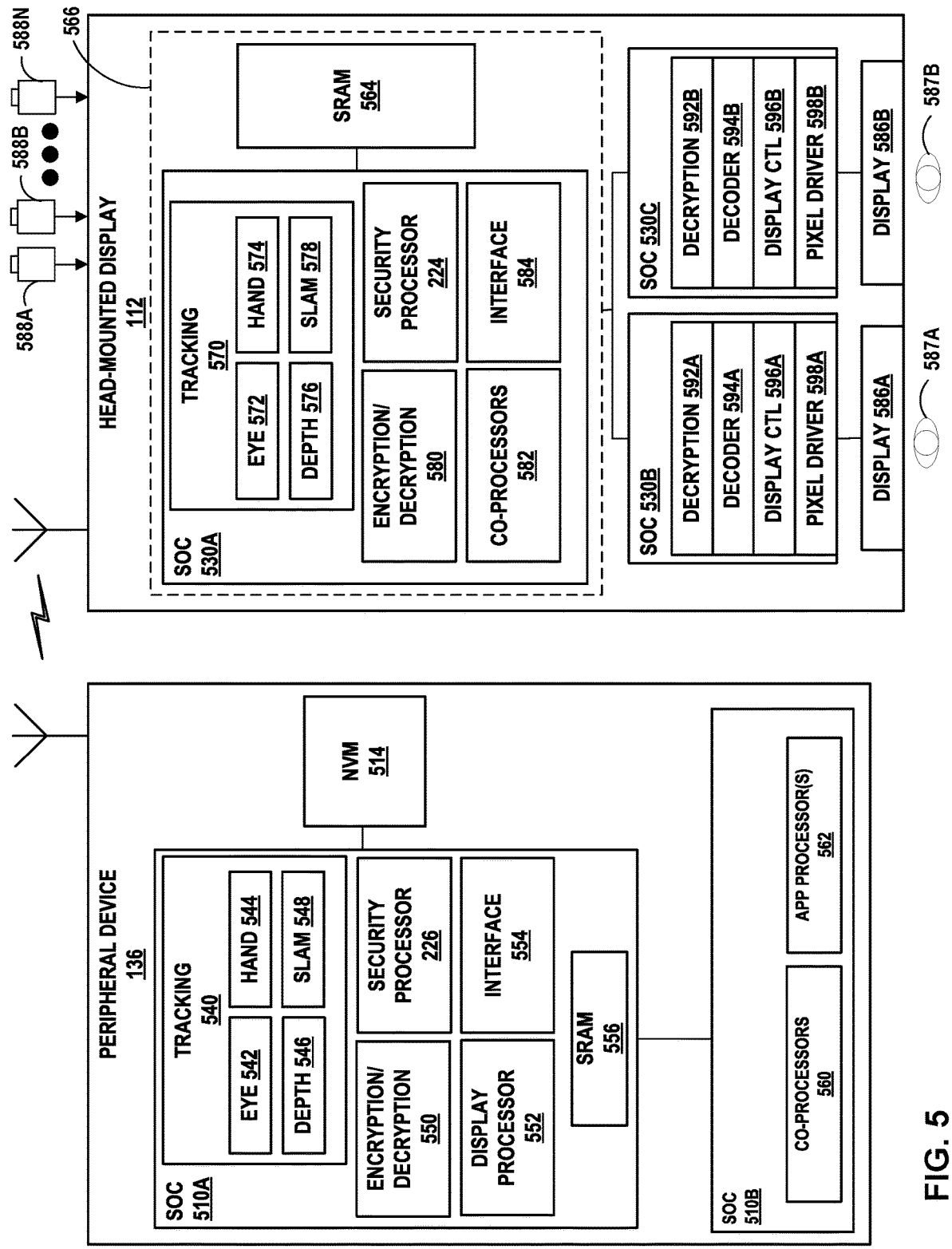
FIG. 5 is a block diagram illustrating an example implementation of a distributed architecture for a multi-device artificial reality system in which one or more devices are implemented using one or more system-on-a-chip (SoC) integrated circuits within each device and having wireless communication systems according to techniques of this disclosure.

FIG. 5 is a block diagram illustrating a more detailed example implementation of a distributed architecture for a multi-device artificial reality system in which one or more devices (e.g., a peripheral device 136 and HMD 112) are implemented using one or more SoC integrated circuits within each device. FIG. 5 illustrates an example in which HMD 112 operates in conjunction with peripheral device 136. Peripheral device 136 represents a physical, real-world device having a surface on which multi-device artificial reality systems, such as systems 100, overlays virtual content. Peripheral device 136 may include an interface 554 having one or more presence-sensitive surface(s) for detecting user inputs by detecting a presence of one or more objects (e.g., fingers, stylus, etc.) touching or hovering over locations of presence-sensitive surfaces. In some examples, peripheral device 136 may have a form factor similar to any of a smartphone, a tablet computer, a personal digital assistant (PDA), or other hand-held device. In other examples, peripheral device 136 may have the form factor of a smartwatch, a so-called "smart ring," or other wearable device. Peripheral device 136 may also be part of a kiosk or other stationary or mobile system. Interface 554 may incorporate output components, such as one or more display device(s), for outputting visual content to a screen. As described above, HMD 112 is architected and configured to enable the execution of artificial reality applications.

In this example, HMD 112 and peripheral device 136 include SoCs 530, 510, respectively, that represent a collection of specialized integrated circuits arranged in a distributed architecture and configured to provide an operating environment for artificial reality applications. As examples, SoC integrated circuits may include specialized functional blocks operating as co-application processors, sensor aggregators, encryption/decryption engines, security processors, hand/eye/depth tracking and pose computation elements, video encoding and rendering engines, display controllers and communication control components. FIG. 5 is merely one example arrangement of SoC integrated circuits. The distributed architecture for a multi-device artificial reality system may include any collection and/or arrangement of SoC integrated circuits.

In the example of FIG. 5, HMD 112 includes a stacked SoC/SRAM integrated circuit component 566 in accordance with the techniques of the present disclosure. In particular, stacked SoC/SRAM integrated circuit component 566 includes a SoC 530A and a SRAM 568. SRAM 568 is separated or external (e.g., not on-die) from the processor(s) and other on-die circuitry of SoC 530A. Peripheral device 136, in this example, is implemented using a traditional SoC architecture, in which SoC 510A includes an on-die SRAM 556 and external (off-die) non-volatile local memory 514. In contrast, in accordance with the techniques of the present disclosure, SoC 530A does not include an external non-volatile local memory; instead, SRAM 568 of stacked SoC/SRAM integrated circuit component 566 has sufficient memory capacity to perform the functions of both traditional on-die SRAM (such as SRAM 556) and external non-volatile local memory (such as NVM 514).

Head-mounted displays, such as HMD 112 as used in AR/VR systems as described herein, can benefit from the reduction in size, increased processing speed and reduced power consumption provided by the stacked SoC/SRAM integrated circuit component 566. For example, the benefits provided by the stacked SoC/SRAM integrated circuit component 566 in accordance with the techniques of the present disclosure can result in increased comfort for the wearer and a more fully immersive and realistic AR/VR experience.

In addition, it shall be understood that any of SoCs 510 and/or 530 may be implemented using the stacked SoC/SRAM integrated circuit component in accordance with the techniques of the present disclosure, and that the disclosure is not limited in this respect. Any of the SoCs 510 and/or 530 may benefit from the reduced size, increased processing speed and reduced power consumption provided by stacked SoC/SRAM integrated circuit component 566. In addition, the benefits provided by the stacked SoC/SRAM component in accordance with the techniques of the present disclosure are not only advantageous for AR/VR systems, but may also be advantageous in many applications such as autonomous driving, edge-based artificial intelligence, Internet-of-Things, and other applications which require highly responsive, real-time decision-making capabilities based on analysis of data from a large number of sensor inputs.

In this example, SoC 530A of HMD 112 comprises functional blocks including security processor 224, tracking 570, an encryption/decryption 580, co-processors 582, and an interface 584. Tracking 570 provides a functional block for eye tracking 572 ("eye 572"), hand tracking 574 ("hand 574"), depth tracking 576 ("depth 576"), and/or Simultaneous Localization and Mapping (SLAM) 578 ("SLAM 578"). For example, HMD 112 may receive input from one or more accelerometers (also referred to as inertial measurement units or "IMUs") that output data indicative of current acceleration of HMD 112, GPS sensors that output data indicative of a location of HMD 112, radar or sonar that output data indicative of distances of HMD 112 from various objects, or other sensors that provide indications of a location or orientation of HMD 112 or other objects within a physical environment. HMD 112 may also receive image data from one or more image capture devices 588A-588N (collectively, "image capture devices 588"). Image capture devices may include video cameras, laser scanners, Doppler radar scanners, depth scanners, or the like, configured to output image data representative of the physical environment. More specifically, image capture devices capture image data representative of objects (including peripheral device 136 and/or hand) in the physical environment that are within a field of view of image capture devices, which typically corresponds with the viewing perspective of HMD 112. Based on the sensed data and/or image data, tracking 570 determines, for example, a current pose for the frame of reference of HMD 112 and, in accordance with the current pose, renders the artificial reality content.

Encryption/decryption 580 of SoC 530A is a functional block to encrypt outgoing data communicated to peripheral device 136 or a security server and decrypt incoming data communicated from peripheral device 136 or a security server. Co-application processors 582 includes one or more processors for executing instructions, such as a video processing unit, graphics processing unit, digital signal processors, encoders and/or decoders, and/or others.

Interface 584 of SoC 530A is a functional block that includes one or more interfaces for connecting to functional blocks of SoC 530B and/or 530C. As one example, interface 584 may include peripheral component interconnect express (PCIe) slots. SoC 530A may connect with SoC 530B, 530C using interface 584. SoC 530A may connect with a communication device (e.g., radio transmitter) using interface 584 for communicating with other devices, e.g., peripheral device 136.

SoCs 530B and 530C of HMD 112 each represents display controllers for outputting artificial reality content on respective displays, e.g., displays 586A, 586B (collectively, "displays 586"). In this example, SoC 530B may include a display controller for display 568A to output artificial reality content for a left eye 587A of a user. For example, SoC 530B includes a decryption block 592A, decoder block 594A, display controller 596A, and/or a pixel driver 598A for outputting artificial reality content on display 586A. Similarly, SoC 530C may include a display controller for display 568B to output artificial reality content for a right eye 587B of the user. For example, SoC 530C includes decryption 592B, decoder 594B, display controller 596B, and/or a pixel driver 598B for generating and outputting artificial reality content on display 586B. Displays 568 may include Light-Emitting Diode (LED) displays, Organic LEDs (OLEDs), Quantum dot LEDs (QLEDs), Electronic paper (E-ink) displays, Liquid Crystal Displays (LCDs), or other types of displays for displaying AR content.

In this example, peripheral device 136 includes SoCs 510A and 510B configured to support an artificial reality application. In this example, SoC 510A comprises functional blocks including security processor 226, tracking 540, an encryption/decryption 550, a display processor 552, and an interface 554. Tracking 540 is a functional block providing eye tracking 542 ("eye 542"), hand tracking 544 ("hand 544"), depth tracking 546 ("depth 546"), and/or Simultaneous Localization and Mapping (SLAM) 548 ("SLAM 548"). For example, peripheral device 136 may receive input from one or more accelerometers (also referred to as inertial measurement units or "IMUs") that output data indicative of current acceleration of peripheral device 136, GPS sensors that output data indicative of a location of peripheral device 136, radar or sonar that output data indicative of distances of peripheral device 136 from various objects, or other sensors that provide indications of a location or orientation of peripheral device 136 or other objects within a physical environment. Peripheral device 136 may in some examples also receive image data from one or more image capture devices, such as video cameras, laser scanners, Doppler radar scanners, depth scanners, or the like, configured to output image data representative of the physical environment. Based on the sensed data and/or image data, tracking block 540 determines, for example, a current pose for the frame of reference of peripheral device 136 and, in accordance with the current pose, renders the artificial reality content to HMD 112.

Encryption/decryption 550 of SoC 510A encrypts outgoing data communicated to HMD 112 or security server and decrypts incoming data communicated from HMD 112 or security server. Encryption/decryption 550 may support symmetric key cryptography to encrypt/decrypt data using a session key (e.g., secret symmetric key). Display processor 552 of SoC 510A includes one or more processors such as a video processing unit, graphics processing unit, encoders and/or decoders, and/or others, for rendering artificial reality content to HMD 112. Interface 554 of SoC 510A includes one or more interfaces for connecting to functional blocks of SoC 510A. As one example, interface 584 may include peripheral component interconnect express (PCIe) slots. SoC 510A may connect with SoC 510B using interface 584. SoC 510A may connect with one or more communication devices (e.g., radio transmitter) using interface 584 for communicating with other devices, e.g., HMD 112.

SoC 510B of peripheral device 136 includes co-application processors 560 and application processors 562. In this example, co-application processors 560 includes various processors, such as a vision processing unit (VPU), a graphics processing unit (GPU), and/or central processing unit (CPU). Application processors 562 may execute one or more artificial reality applications to, for instance, generate and render artificial reality content and/or to detect and interpret gestures performed by a user with respect to peripheral device 136.

Figure 6:
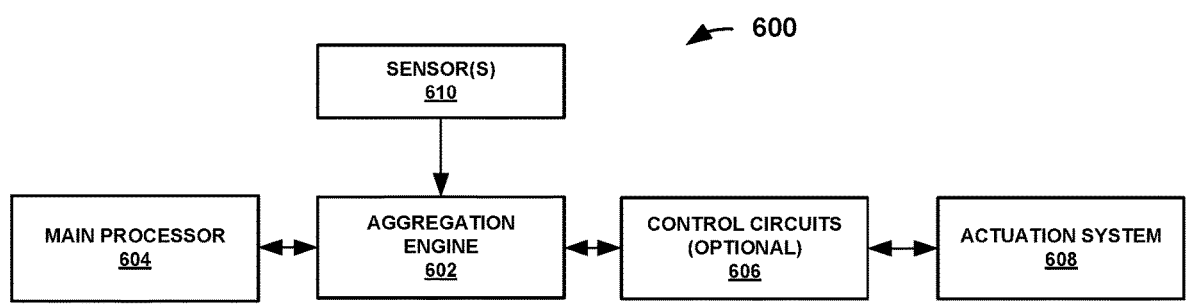
FIG. 6 is a block diagram of a sensor aggregation system which may incorporate a stacked SoC/SRAM integrated circuit component in accordance with the techniques described in this disclosure.

FIG. 6 is a block diagram of another example system, i.e., a sensor aggregation system 600 in this example, which may incorporate a stacked SoC/SRAM integrated circuit component in accordance with the present disclosure. In this example, sensor aggregation system 600 includes a main processor 604, an aggregation engine 602, optional control circuits 606, sensors 610 and a physical actuation system 608. In this example, aggregation engine 602 may be implemented using a stacked SoC/SRAM integrated circuit component in accordance with the present disclosure. Examples of such sensor aggregation systems 600 include AR/VR, autonomous driving, and edge-based artificial intelligence (AI) systems. Such applications require highly responsive, often real-time decision-making capability based on analysis of data from a large number of sensor inputs. In addition, a reduction in the size and/or weight of the electronic components of such systems is often desired. Such miniaturization can lead to increased comfort for a wearer (as in the case of AR/VR system described herein, for example), an increase in processing speed and/or reduced power consumption.

In an AR/VR application, such as those described in FIGS. 1-5 for example, sensor(s) 610 may include one or more inertial measurement units (IMUs), each including one or more accelerometers and/or gyroscopes for tracking motion of a HMD worn on the head of a user and/or for tracking motion of one or more controllers held or attached to the hands of the user. Sensor(s) 610 may also include one or more image capture devices, such as cameras or line scanners, for capturing image data of the surrounding physical environment. Actuation system 608 includes the display component (such as an HMD) which displays the augmented or virtual reality content as determined by the main processor 604. Aggregation engine 602 aggregates the raw sensor data received from sensor(s) 610 into a form for analysis by main processor 604. Main processor 604 analyzes the aggregated sensor data and generates artificial reality content to be displayed by the actuation system 608 based on the analysis. In this example, aggregation engine 602 may be implemented with a stacked SoC/SRAM integrated circuit component in accordance with the techniques described in this disclosure.

Figure 7A:
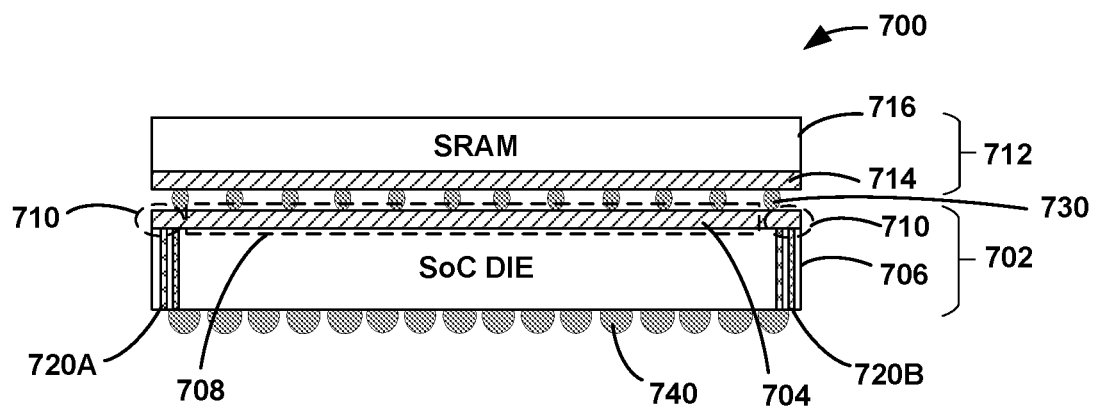
FIG. 7A is a cross-sectional schematic illustration of an example stacked SoC/SRAM integrated circuit component in accordance with the techniques described in this disclosure, taken along the line A-A' of FIG. 7B.
Figure 7B:
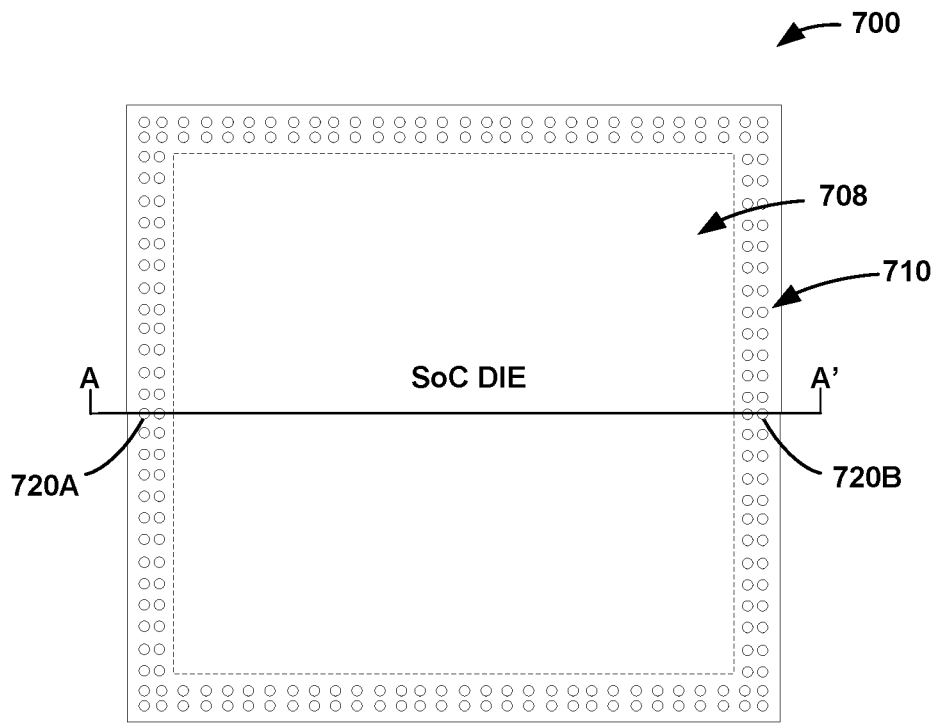
FIG. 7B is a top view schematic illustration from the frontside of the SoC die of the example stacked SoC/SRAM integrated circuit component of FIG. 7A.

FIG. 7A is a cross-sectional schematic illustration of an example stacked SoC/SRAM integrated circuit component in accordance with the techniques described in this disclosure, taken along the line A-A' of FIG. 7B. FIG. 7B is a top view schematic illustration from the frontside of the SoC die of the example stacked SoC/SRAM integrated circuit component of FIG. 7A. Stacked SoC/SRAM integrated circuit component 700 includes a SoC die 702 and a SRAM subcomponent 712 bonded face-to-face in a vertically stacked arrangement. SoC die 702 includes an active side 704 and an opposing non-active side 706. SRAM subcomponent 712 similarly includes an active side 714 and an opposing non-active side 716. To form the face-to-face bond (indicated by interconnection points 730), I/O pads on active side 704 of SoC die 702 are connected to I/O pads on active side 714 of SRAM subcomponent 712 directly with no intermediate redistribution layer (RDL) routing. The interconnection points can be conductive bumps (such as Cu or solder) formed on the SoC or the SRAM; or conductive pads (such as Cu) surrounded by dielectric layers (such as oxides, nitrides or carbides); and the interconnections may be formed by a process of solder reflow, thermal compression bonding or hybrid dielectric-to-dielectric bonding. This face-to-face bond between SoC die 702 and SRAM subcomponent 712 enables higher bandwidth and performance with lower power dissipation.

The SRAM subcomponent could be a single SRAM die or a mini-stack of multiple SRAM die referred to herein as a "SRAM cube." The "SRAM cube" version may help to expand the memory capacity of the SRAM subcomponent thereby making it easier to eliminate the need for a local memory (DRAM). Thus, although the SRAM subcomponent is shown as a single SRAM die, it shall be understood that the disclosure is not limited in this respect.

Stacked SoC/SRAM component 700 further includes a plurality of TSVs, such as TSVs 720A and 720B, referred to herein collectively as TSVs 720. TSVs 720 are used to bring Input/Output (I/O) from the active side 704 of SoC die 702 out to opposing non-active side 706. There can be one or more rows of TSVs arranged along the perimeter of the die to make up the required number of IO's required for the application. In FIGS. 7A and 7B for example, there are two rows of TSVs along each side of the perimeter of the die. The TSVs are not necessarily shown to scale but are for illustrative purposes only. It shall be understood that any suitable number of rows or other arrangement of the TSVs may be used, and that each side may include different arrangements of the TSVs in accordance with the needs of the application, and that the disclosure is not limited in this respect.

Active side 704 of SoC die 702 includes an active area (also referred to herein as a functional area) indicated by dashed line 708. Active area 708 includes one or more active elements (e.g., transistors) formed on the active side 704 of SoC die 702. Active side 704 of SoC die 702 also includes non-active or non-functional areas 710 located generally around the periphery of the active area 708. Non-active areas 710 are non-functional in the sense that they do not include any active elements. In this example, TSVs 720 are formed from the backside in non-functional areas 710 of SoC die 702 to bonding pads on the frontside of SoC die 702. The bond pads may be located on the front surface of the side 702 or slightly recessed or embedded below the front surface. Backside 706 of SoC die 702 includes redistribution layers (RDLs) and conductive bumps or pads 740 used to connect stacked SoC/SRAM component 700 to other integrated circuit components to form a complete system. For example, stacked SoC/SRAM integrated circuit component 700 may be connected to other integrated circuit components to form part of a system to render artificial reality images.

Figure 8:
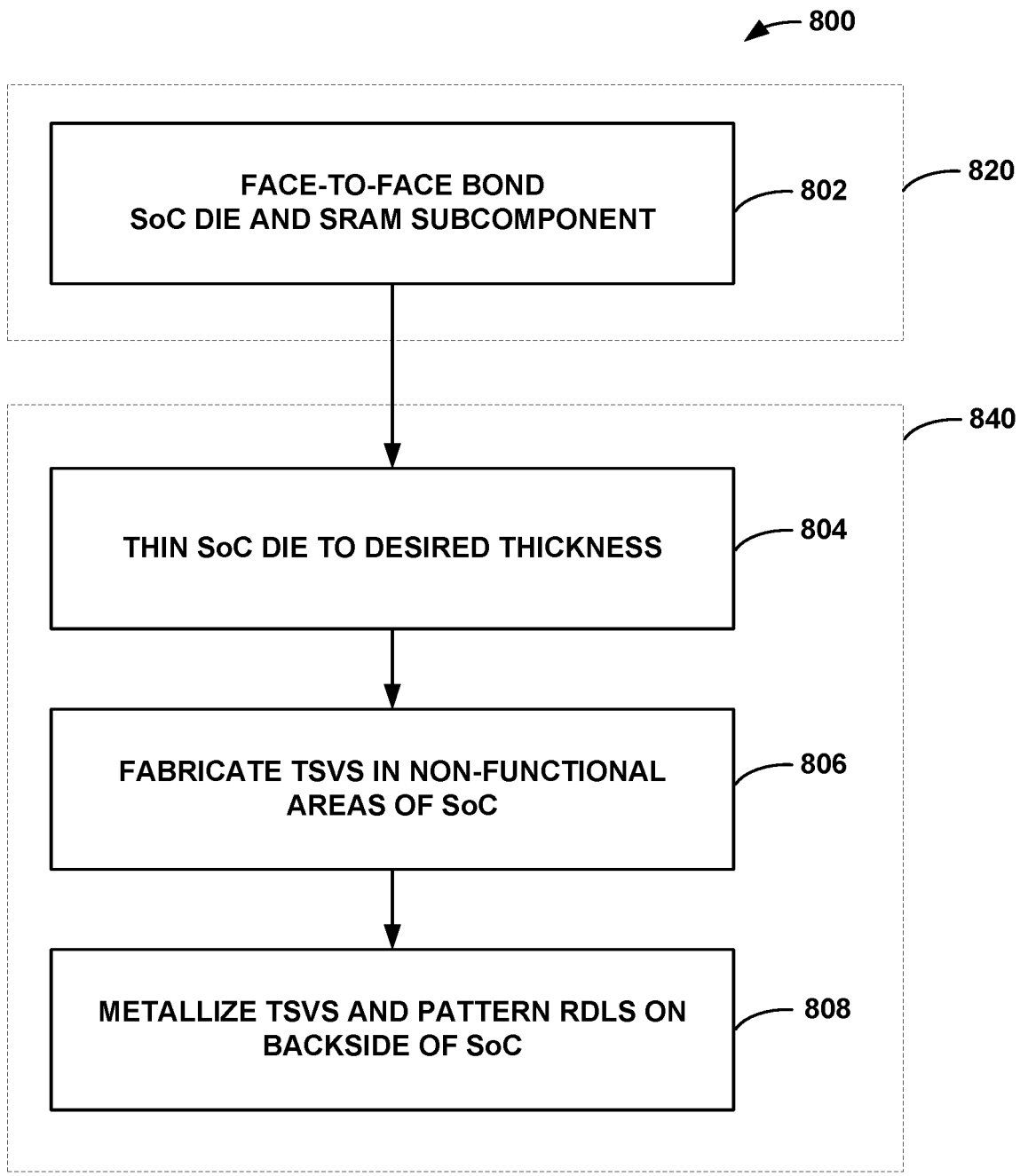
FIG. 8 is a flowchart of an example method of fabricating a stacked SoC/SRAM integrated circuit component, in accordance with the techniques described in this disclosure.
Figure 9:
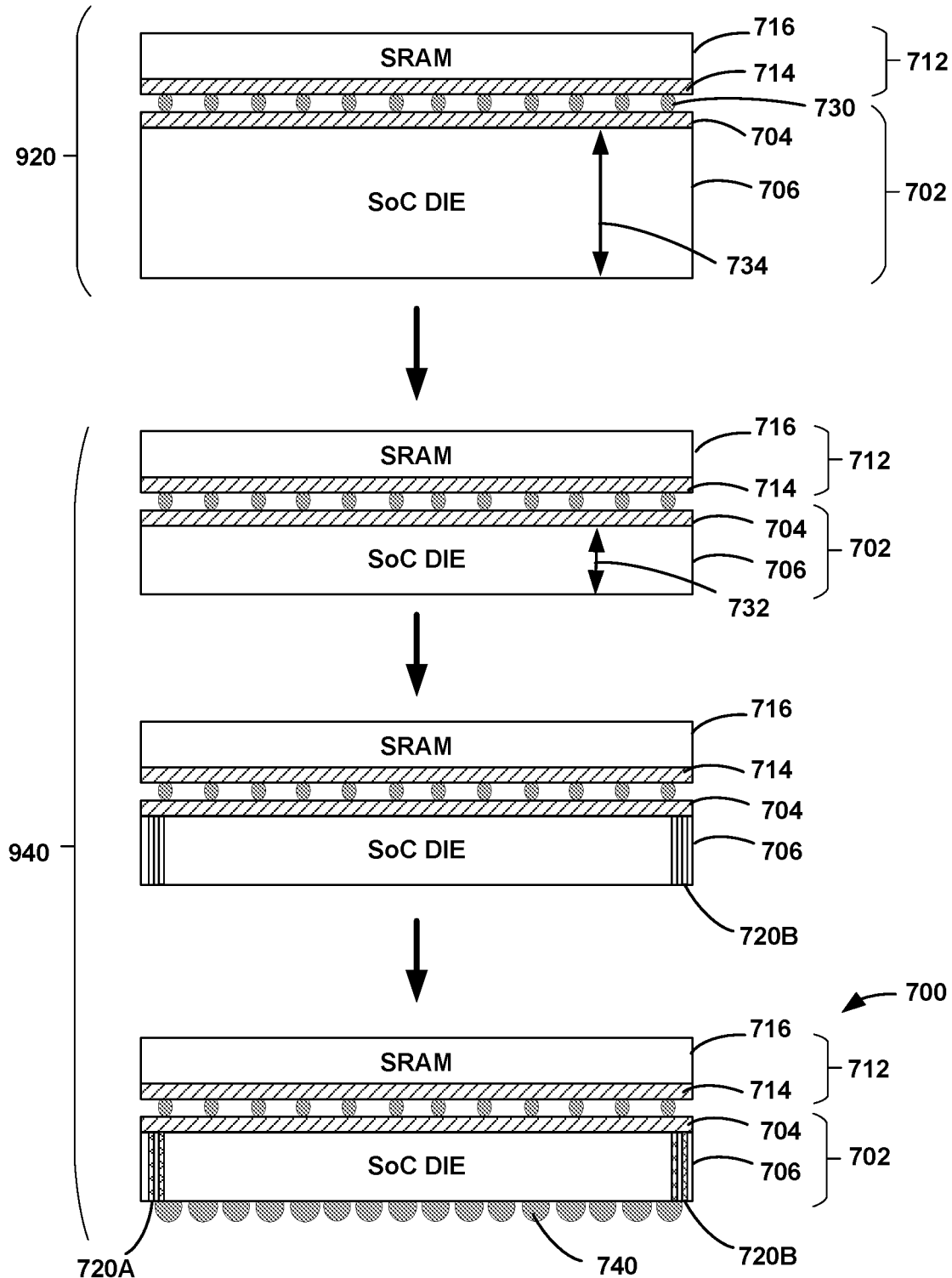
FIG. 9 is a schematic of fabrication of a stacked SoC/SRAM component illustrating the method steps of FIG. 8, in accordance with the techniques described in this disclosure.

FIGS. 8 and 9 illustrate an example method of fabricating a stacked SoC/SRAM integrated circuit component, such as that shown in FIGS. 7A and 7B, and will be described concurrently. FIG. 8 is a flowchart of an example method of fabricating a stacked SoC/SRAM integrated circuit component, in accordance with the techniques described in this disclosure. FIG. 9 is a schematic of fabrication of a stacked SoC/SRAM component illustrating the method steps of FIG. 8, in accordance with the techniques described in this disclosure.

The example fabrication process (800) for the stacked SoC/SRAM component may include a first stage (820) and a second stage (840). The first stage (820) of the fabrication process (800) includes face-to-face bonding of a SoC die and a SRAM subcomponent (802). The first stage may be performed at a first location, such as a first semiconductor fabrication plant or foundry. During face-to-face bonding, the SoC I/O pads are connected to the SRAM I/O pads directly with no intermediate redistribution layer (RDL) routing, which enables higher bandwidth and performance with lower power dissipation.

The second stage (840) of the fabrication process includes formation of TSVs in non-functional areas of the around the periphery of the SoC active circuitry (806). The TSVs may be formed from the backside of the SoC die to bonding pads on the frontside of the SoC die. In some examples, the TSVs may be formed using a so-called via-last through-silicon via technology. The second stage (840) of the fabrication process also includes metallization of the TSVs and patterning of redistribution layers (RDLs) on the backside of the SoC wafer (808).

In some examples, the second stage (840) of the fabrication process (800) may be performed at the first location. In other examples, the second stage (840) may be performed at a second, different location, such as a different semiconductor fabrication and/or packaging facility. In those examples where the second stage (840) of the fabrication process is performed at a different location than the first stage, the second stage (840) may also include thinning the SoC die to a desired thickness before forming the TSVs (804). In those examples, the thickness of the SoC die produced from the first stage (820) of the fabrication process may be relative greater than the final thickness of the SoC die to aid in shipping and transport between the first location and the second location. Thinning of the SoC die (804) may include grinding down the backside (or backgrinding) of the SoC wafer from a first thickness to a second thickness, wherein the first thickness is relatively greater than the second thickness. In some examples, the second thickness is such that the thinned SoC die has a thickness dimension in which TSVs may be formed from the backside of the SoC die to bonding pads on the frontside of the SoC die without requiring a TSV reveal process. In one example, the first thickness may be about 775 micrometers (µm) and the second thickness may be in a range of about 25 to 200 µm. However, it shall be understood that the disclosure is not limited to the specific thicknesses described herein, and that fabrication process (800) may be accomplished using any suitable thicknesses.

In some examples, the size of a TSV may be on the order of about 30 µm in diameter and 150 µm high and 100 µm pitch (the height of the TSV is roughly equal to the thickness of the silicon die). There can be one or more rows of TSVs arranged along the perimeter of the die to make up the required number of IO's required for the application. The normalized density of TSV's expressed in number of IO per unit area of the die can be in the range of 5-25 IO per mm$^2$ for typical AR/VR applications, e.g., approximately 300 TSV's on a 5×5 mm die.

As shown in FIG. 9, the example fabrication process for the stacked SoC/SRAM component may include a first stage indicated by reference numeral 920 and a second stage indicated by reference numeral 940. The first stage 920 of the fabrication process includes face-to-face bonding of a SoC die 702 and a SRAM subcomponent 704. The first stage may be performed at a first location, such as a first semiconductor fabrication plant or foundry. During face-to-face bonding (indicated by solder bumps 730), I/O pads on the active side 704 of SoC die 702 are directly connected to I/O pads on active side 714 of SRAM subcomponent 704.

The second stage 940 of the fabrication process may include thinning of the SoC die 702. The thinning may be accomplished by backgrinding the SoC die down from a first thickness indicated by reference numeral 732 to a second thickness indicated by reference numeral 734. The first thickness 732 is relatively greater than the second thickness 734. In one example, first thickness 732 may be about 775 micrometers (μm) and second thickness 734 may be in a range of about 25 to 200 μm.

The second stage 940 includes formation of TSVs 720 in non-functional areas 710 of the around the periphery of the SoC active circuitry 708. In this example, TSVs 720 are formed from the backside 706 of the SoC die to bonding pads on the frontside 704 of the SoC die. During the thinning process, the second thickness may be chosen such that TSVs 720 may be formed in the SoC die without requiring a TSV reveal process. The second stage 940 of the fabrication process also includes metallization of TSVs 720 and patterning of redistribution layers (RDLs) and conductive bumps or pads 730 on the backside 706 of the SoC die 702.

In some examples, both the first stage 920 and the second stage 940 of the fabrication process may be performed at a first location, such as a first semiconductor fabrication plant or foundry. In those examples, the second stage need not necessarily include thinning of the SoC die from the first thickness 732 to the second thickness 734. For example, if after completion of the first stage 920 the first thickness 734 is such that TSVs may be formed in the non-functional areas of SoC die 702 without requiring a TSV reveal process, then the thinning step may be eliminated. In other examples, the second stage 940 may be performed at a second, different location, such as a second, different semiconductor fabrication and/or packaging facility. In those examples where the second stage 940 of the fabrication process is performed at a different location than the first stage, the second stage 940 may include thinning the SoC die from first thickness 732 to second thickness 734 before forming the TSVs 720. For example, the first thickness after completion of the first stage 920 may be chosen to aid in shipping and transport of the face-to-face bonded SoC die 702 and SRAM subcomponent 704.

In some AR/VR applications, for example, the I/O density of the stacked SoC/SRAM component is such that TSVs 720 may be formed in non-functional areas around the periphery of the active SoC circuitry, thus allowing the second stage 940 of the fabrication process to be completed at a different facility and/or location than the first stage 920 of the fabrication process. TSV design and fabrication is often confidential and foundry-specific, and can also affect the layout of the SoC active circuits if the TSVs are interposed within the active area of the SoC die. The techniques of the present disclosure enable the second stage 940 of the fabrication process (TSV fabrication) to be performed separately from the first stage 920 (SoC die fabrication and/or face-to-face bonding), meaning that the SoC design for the stacked SoC/SRAM integrated circuit component is more transferrable from one foundry to another. In addition, use of TSVs in non-functional areas may also result in a reduction in parasitic effects and reduced power consumption due to a decrease in the length of the signal paths provided by the perimeter TSV's.

By stacking the SRAM with the SoC die, the physical dimensions (e.g., length and width) of the stacked SoC/SRAM integrated circuit component may be significantly reduced as compared to traditional SoCs with on-die SRAM. In addition, the physical dimensions of the stacked SRAM subcomponent may be increased as compared to traditional on-die SRAM. The stacked SRAM subcomponent may thus provide sufficient memory capacity to perform the functions of both on-die SRAM and high-speed local memory required with traditional SoC components, thus eliminating the need for a separate high-speed local memory subcomponent. The stacked SoC/SRAM integrated circuit component described herein, and the described methods for manufacturing the stacked SoC/SRAM integrated circuit component, may provide technical solutions to the miniaturization problem of the on-die SRAM and may also result in a reduction in parasitic effects and reduced power consumption due to a decrease in the length of the signal paths provided by the perimeter TSV's. Use of TSVs in non-functional areas, as described herein, may also increase design flexibility in that the TSVs are not located within the active circuitry of the SoC die. In addition, the techniques described herein enable fabrication of the SoC/SRAM stack and formation of the TSVs to be carried out at separate facilities, if desired, thus increasing manufacturing flexibility and reducing cost.

An example of the impact that the stacked SoC/SRAM subcomponent has on the physical dimensions and the memory capacity of the resulting integrated circuit component as compared to a traditional SoC with on die SRAM may be described as follows. The physical size of a traditional SoC with on die SRAM may be on the order of about 25 $mm^2$ of which the size of the on die SRAM would be about 8-10 $mm^2$. In accordance with the present disclosure, when the SRAM is separated from the SOC die and configured in a stacked arrangement, the physical size of the SoC could drop to, for example, on the order of 16 $mm^2$ and the size of the stacked SRAM subcomponent would increase to be on the order of 16 $mm^2$ (i.e., approximately the same size as the SoC die). The physical area of the SRAM subcomponent in accordance with the present disclosure may thus increase by about 1.8-2 times the size of a traditional on die SRAM. Thus, in this example, the size of the SoC as a whole would decrease by 36% while at the same time increase the memory capacity of the SRAM by 60-100%.

Referring again to FIGS. 8 and 9, in another example, the first stage 820, 920, and the second stage 840, 940 of the fabrication process may be performed away from the location(s) where the SoC die and SRAM subcomponent are fabricated. In that example, the first stage 820, 920 (face-to-face bonding of the SoC die and SRAM subcomponent), and the second stage 840, 940 (formation of TSVs) of the fabrication process may be performed in, for example, a packaging facility, that location being different form the wafer fab or foundries where the SoC and the SRAM subcomponent are themselves fabricated. In such situations, the order of the first stage 820, 920 and the second stage 840, 940 may be reversed (i.e., first do TSV formation then do face-to-face bonding) as there is no shipping to a different location involved.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs or videos). The artificial reality content may include video, audio, haptic feedback, or some combination thereof, and any of which may be presented in a single channel or in multiple channels (such as stereo video that produces a three-dimensional effect to the viewer). Additionally, in some examples, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The techniques described in this disclosure may be implemented, at least in part, in hardware, software, firmware or any combination thereof. For example, various aspects of the described techniques may be implemented within one or more processors, including one or more microprocessors, DSPs, application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

What is claimed is:

1. An artificial reality system comprising: a head mounted display (HMD) configured to output artificial reality content, the HMD including at least one stacked integrated circuit component, wherein the at least one stacked integrated circuit component comprises: a system-on-a-chip (SoC) die having a frontside and a backside, wherein the frontside of the SoC die includes an active area including one or more active elements and one or more Input/Output (I/O) pads, and wherein the frontside of the SoC die further includes at least one non-active area outside of the active area; a static random-access memory (SRAM) subcomponent having a frontside and a backside, wherein the frontside of the SRAM subcomponent includes an active area including one or more active elements and one or more I/O pads bonded to the one or more I/O pads of the SoC die in a face-to-face, vertically stacked arrangement with no intermediate redistribution layer (RDL) routing; and a plurality of through-silicon vias (TSVs) formed from the backside of the SoC die to the frontside of the SoC die, wherein the plurality of TSVs are formed in the at least one non-active area of the SoC die and wherein none of the plurality of the TSVs are formed within the active area of the SoC die.

2. The artificial reality system of claim 1 wherein the at least one non-active area is located around the periphery of the active area.

3. The artificial reality system of claim 2 wherein the TSVs are formed in the at least one non-active area around the periphery of the active area.

4. The artificial reality system of claim 1 wherein the plurality of TSVs are formed from the backside of the SoC die to bonding pads patterned on or near the frontside of the SoC die in the at least one non-active area.

5. The artificial reality system of claim 1 further comprising a plurality of conductive bumps patterned on the backside of the SoC die.

6. The artificial reality system of claim 1 further comprising redistribution layers (RDLs) patterned on the backside of the SoC die.

7. The artificial reality system of claim 1 further comprising:
a plurality of sensors configured to output motion data representative of motion of a user;
wherein the SoC processes the motion data representative of motion of a user received from one or more of the plurality of sensors.

8. The artificial reality system of claim 7 wherein the plurality of sensors includes at least one inertial measurement unit.

9. The artificial reality system of claim 1 further comprising:
one or more image capture devices configured to output image data representative of a physical environment corresponding to a viewing perspective of the HMD;
wherein the SoC processes the image data representative of the physical environment received from one or more of the image capture devices.

10. The artificial reality system of claim 1 wherein the SRAM subcomponent includes a single SRAM die.

11. The artificial reality system of claim 1 wherein the SRAM subcomponent includes a stack of multiple SRAM die.

12. An integrated circuit component comprising: a system-on-a-chip (SoC) die having a frontside and a backside, wherein the frontside of the SoC die includes an active area including one or more active elements and one or more Input/Output (O/I) pads, and wherein the frontside of the SoC die further includes at least one non-active area outside of the active area; a static random-access memory (SRAM) subcomponent having a frontside and a backside, wherein the frontside of the SRAM subcomponent includes an active area including one or more active elements and one or more I/O pads bonded to the one or more I/O pads of the SoC die in a face-to-face, vertically stacked arrangement with no intermediate redistribution layer (RDL) routing; and a plurality of through-silicon vias (TSVs) formed from the backside of the SoC die to the frontside of the SoC die, wherein each of the plurality of TSVs are formed in the at least one non-active area of the SoC die and wherein none of the plurality of the TSVs are formed within the active area of the SoC die.

13. The integrated circuit component of claim 12 wherein the at least one non-active area is located around the periphery of the active area.

14. The integrated circuit component of claim 13 wherein the TSVs are formed in the at least one non-active area around the periphery of the active area.

15. The integrated circuit component of claim 12 wherein the plurality of TSVs are formed from the backside of the SoC die to bonding pads patterned on or near the frontside of the SoC die in the at least one non-active area.

16. The integrated circuit component of claim 12 further comprising a plurality of solder bumps patterned on the backside of the SoC die.

17. The integrated circuit component of claim 12 further comprising redistribution layers (RDLs) patterned on the backside of the SoC die.

18. The integrated circuit component of claim 12 wherein the SRAM subcomponent includes a single SRAM die.

19. The integrated circuit component of claim 12 wherein the SRAM subcomponent includes a stack of multiple SRAM die.

20. A method comprising: providing a system-on-a-chip (SoC) die having a frontside and an oppositely facing backside; bonding one or more Input/Output (I/O) pads on the frontside of the SoC die to one or more I/O pads on a frontside of a static random-access memory (SRAM) subcomponent in a face-to-face, vertically stacked arrangement with no intermediate redistribution layer (RDL) routing, wherein the frontside of the SoC die includes an active area including one or more active elements, and wherein the frontside of the SoC die further includes at least one non-active area outside of the active area, and wherein the frontside of the SRAM subcomponent includes an active area including one or more active elements; thinning the SoC die from a first thickness to a second thickness, wherein the first thickness is relatively greater than the second thickness, and wherein the thinning includes thinning the SoC die from the backside of the SoC die; forming a plurality of through-silicon vias (TSVs) from the backside of the SoC die to the frontside of the SoC die, wherein the plurality of TSVs are formed in the at least one non-active area of the SoC die and wherein none of the plurality of the TSVs are formed within the active area of the SoC die; and metallizing the TSVs from the backside of the SoC die to the frontside of the SoC die.

21. The method of claim 20 wherein thinning the SoC die includes performing a mechanical grinding process on the backside of the SoC die.

22. The method of claim 20 wherein the TSVs are formed by a via-last through-silicon via technology.

23. The method of claim 20 further comprising patterning of redistribution layers (RDLs) on the backside of the SoC die.

24. The method of claim 20, wherein bonding the active side of the SoC die to the active side of the SRAM subcomponent in the face-to-face, vertically stacked arrangement is performed at a first fabricating facility, and wherein thinning the SoC die from the first thickness to the second thickness, forming the plurality of through-silicon vias from the backside of the SoC die to the front side of the SoC die, and metallizing the TSVs from the backside of the SoC die are performed at a second, different fabricating facility.

25. The method of claim 20 wherein thinning the SoC die includes thinning the backside of the SoC die from a thickness of about 775 micrometers ($\mu$m) to a thickness in a range of about 25 to 200 $\mu$m.

26. The method of claim 20 wherein thinning the SoC die includes thinning the backside of the SoC die to the second thickness such that TSVs may be formed from the backside of the SoC die to bonding pads on the frontside of the SoC die without requiring a TSV reveal process.

27. The method of claim 20 wherein the at least one non-active area is located around the periphery of the active area.

28. The method of claim 20 further comprising patterning a plurality of conductive bumps on the backside of the SoC die.

29. The method of claim 20 wherein metallizing the TSVs further comprises metallizing the TSVs from the backside of the SoC die to bonding pads patterned on the frontside of the SoC die in the at least one non-active area.

30. The method of claim 20 wherein the SRAM subcomponent includes a single SRAM die.

31. The method of claim 20 wherein the SRAM subcomponent includes a stack of multiple SRAM die.

32. The method of claim 20 wherein thinning the SoC die from a first thickness to a second thickness and forming the plurality of through-silicon vias (TSVs) from the backside of the SoC die to the frontside of the SoC die occur before bonding the frontside of the SoC die to a frontside of the static random-access memory (SRAM) subcomponent in a face-to-face, vertically stacked arrangement.

\* \* \* \* \*